United States Patent [19]

Williams et al.

[11] Patent Number: 5,013,254

[45] Date of Patent: May 7, 1991

[54] LATCHING MECHANISM FOR TEST PROBE APPARATUS

[75] Inventors: Robert A. Williams, Fort Worth; Jeffrey W. Herron, Arlington, both of Tex.

[73] Assignee: Williams Instruments, Inc., Fort Worth, Tex.

[21] Appl. No.: 593,053

[22] Filed: Oct. 5, 1990

[51] Int. Cl.$^5$ .............................................. H01R 4/38
[52] U.S. Cl. .................... 439/255; 439/254; 439/320; 439/824
[58] Field of Search ............ 439/253, 254, 255, 256, 439/257, 258, 259, 261, 265, 345, 347, 348, 349, 320, 824; 285/82, 84–86, 314–316, 318

[56] References Cited

U.S. PATENT DOCUMENTS

| | | | |
|---|---|---|---|
| 2,939,728 | 6/1960 | Bitel | 285/315 |
| 4,364,624 | 12/1982 | Williams | 439/651 |
| 4,422,704 | 12/1983 | Williams | 439/349 |
| 4,525,016 | 6/1985 | Williams | 439/296 |
| 4,602,123 | 7/1986 | Williams | 174/72 R |
| 4,904,200 | 2/1990 | Williams | 439/349 |
| 4,914,061 | 4/1990 | Williams | 439/349 |

FOREIGN PATENT DOCUMENTS 683011  3/1964  Canada ............................ 285/318

Primary Examiner—David L. Pirlot
Attorney, Agent, or Firm—Arthur F. Zobal

[57] ABSTRACT

A tubular body supports an insulator member at its front end which carries a center contact. An electrical lead is connected to the center contact and extends through the tubular body rearward and out of the apparatus. The insulator member and support structure supports a shell or wall spaced from and surrounding the tubular body with an opening facing rearward. A plurality of angularly spaced apart latch openings extend through the shell. A plurality of latches are pivotally supported to the front portion of the tubular body for movement through the latch openings. A sleeve with a cam movable between forward and rearward latching and unlatching positions is located around the tubular body. In the forward position of the sleeve, the cam and a spring move the latches outward through the latch openings and in the rearward position of the sleeve the latches are moved inward through the latch openings. An electrical lead is electrically coupled to the latches by way of the tubular body.

6 Claims, 4 Drawing Sheets

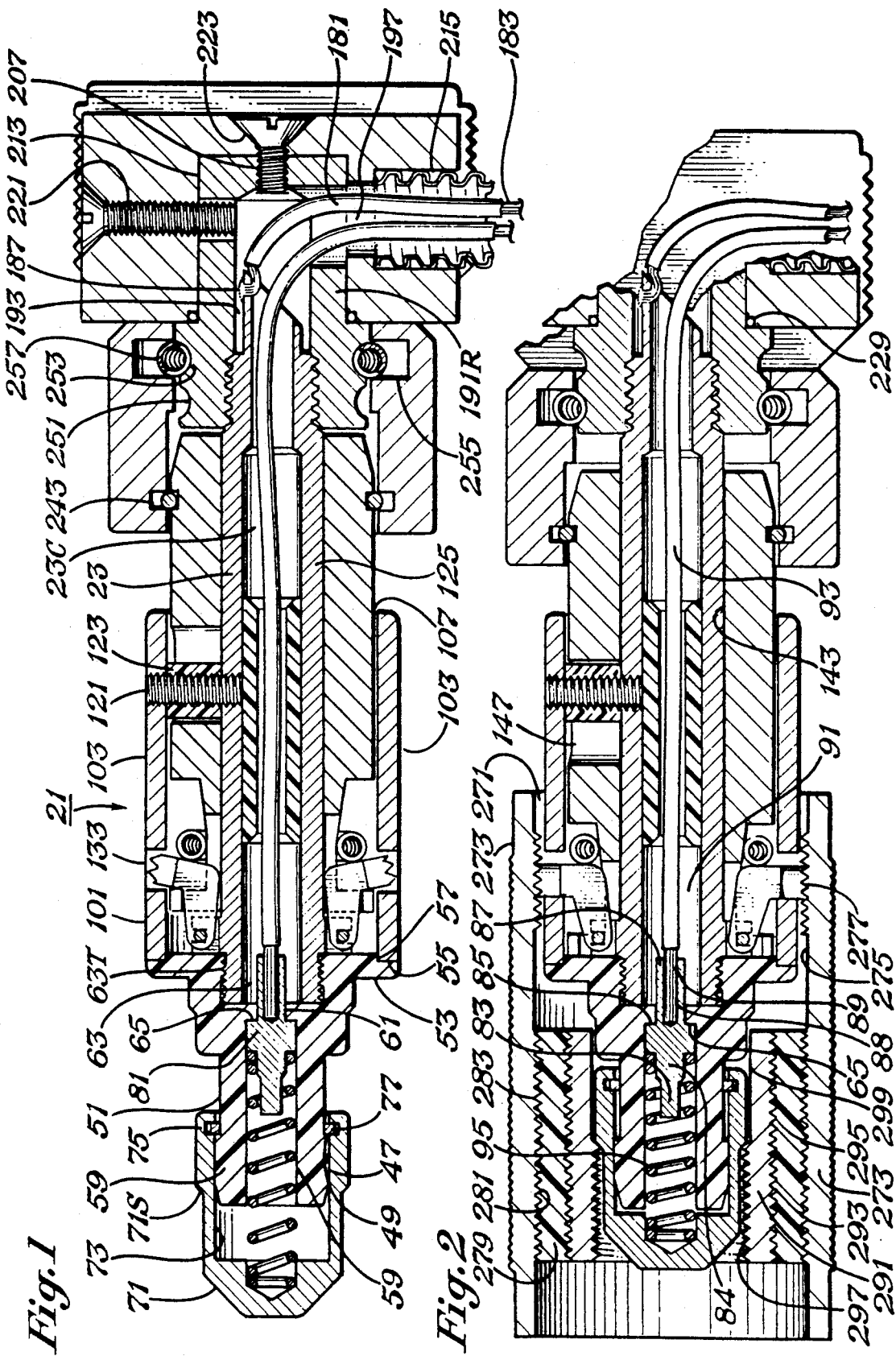

LATCHING MECHANISM FOR TEST PROBE APPARATUS

BACKGROUND OF THE INVENTION

1. Field of the Invention

The invention relates to a latching mechanism for a test probe.

2. Description of the Prior Art

Ball and finger type latching mechanism for latching a test probe in an opening of a device to be tested are well known, for example as disclosed in U.S. Pat. Nos. Re. 28,328 and 3,505,635. Springs have been employed in devices for locking or latching purposes, as shown in U.S. Pat. Nos. 4,355,854, and 4,422,704. U.S. Pat. Nos. 4,174,146, 4,364,624, 4,525,016 and 4,602,123 disclose different types of devices for routing electrical leads. U.S. Pat. Nos. 4,850,893, 4,904,200, and 4,914,061 disclose test probes with different types of latching mechanisms.

SUMMARY OF THE INVENTION

It is an object of the invention to provide a test probe apparatus having a latching mechanism for latching the test probe in an opening of a device to be tested, and which allows electrical connection with the device to be tested by way of a forward contact and the latching mechanism.

The test probe apparatus comprises a body means having a front end and a rear end. Support means carrying a first electrical contact means is supported at the front end of the body means, and a first electrical lead is coupled to said first electrical contact means and extends toward the rear end. Wall means is spaced from and surrounds the body means and defines a surrounding space located between the wall means and the body means, which space has an opening facing rearward. A plurality of angularly spaced apart openings are formed through the wall means. A movable sleeve means, movable between forward and rearward positions, is located around the body means. At least the forward portion of the sleeve means is located for movement in the surrounding space. A plurality of latch means are located in the surrounding space and have coupling portions pivotally coupled to structure of the apparatus at angularly spaced apart positions and latching portions located to move to outward and inward positions through the plurality of openings respectively. At least one of the latch means is electrically insulated from said first electrical contact means whereby said one latch means forms a second electrical contact means. A second electrical lead is coupled to said one latch means and extends out of the apparatus. Engaging means is provided for engaging the plurality of latch means when the sleeve means is moved toward the forward position for moving the latching portions of the plurality of latch means outward through the plurality of openings for use for latching the test probe apparatus to structure of an opening. Retracting means is provided for retracting the latch means to their inward positions when the sleeve means is moved toward the rearward position.

In another aspect, said support means comprises insulator means having forward and rearward ends. The first electrical contact means is supported by the forward end of the electrical insulator means and the front end of the body means is connected to the rearward end of the electrical insulator means. The body means and the plurality of latch means are formed of electrical conducting material. All of the plurality of latch means are pivotally coupled to the front end of the body means and are in electrical contact therewith. The second electrical lead is electrically connected to the body means.

BRIEF DESCRIPTION OF THE DRAWINGS

FIG. 1 is a cross-sectional partial side view of the test probe, shown with the latch members in the unlatched position.

FIG. 2 is a cross-sectional side view of the test probe, shown with the latch members in the latched position.

DESCRIPTION OF THE PREFERRED EMBODIMENT

Figure 3A:
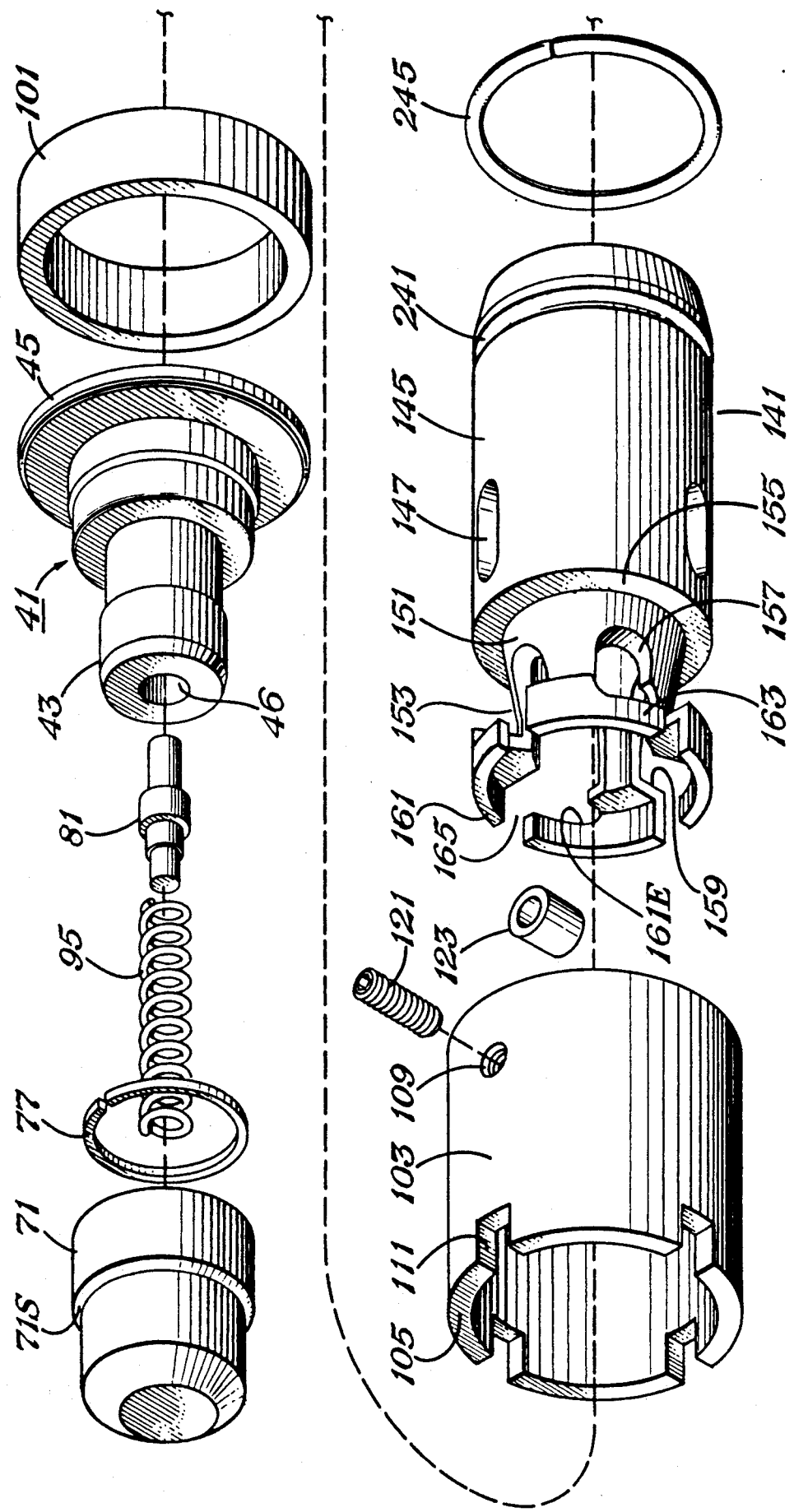
FIGS. 3A, 3B, and 3C are an exploded view of the test probe of the invention.
Figure 3B:
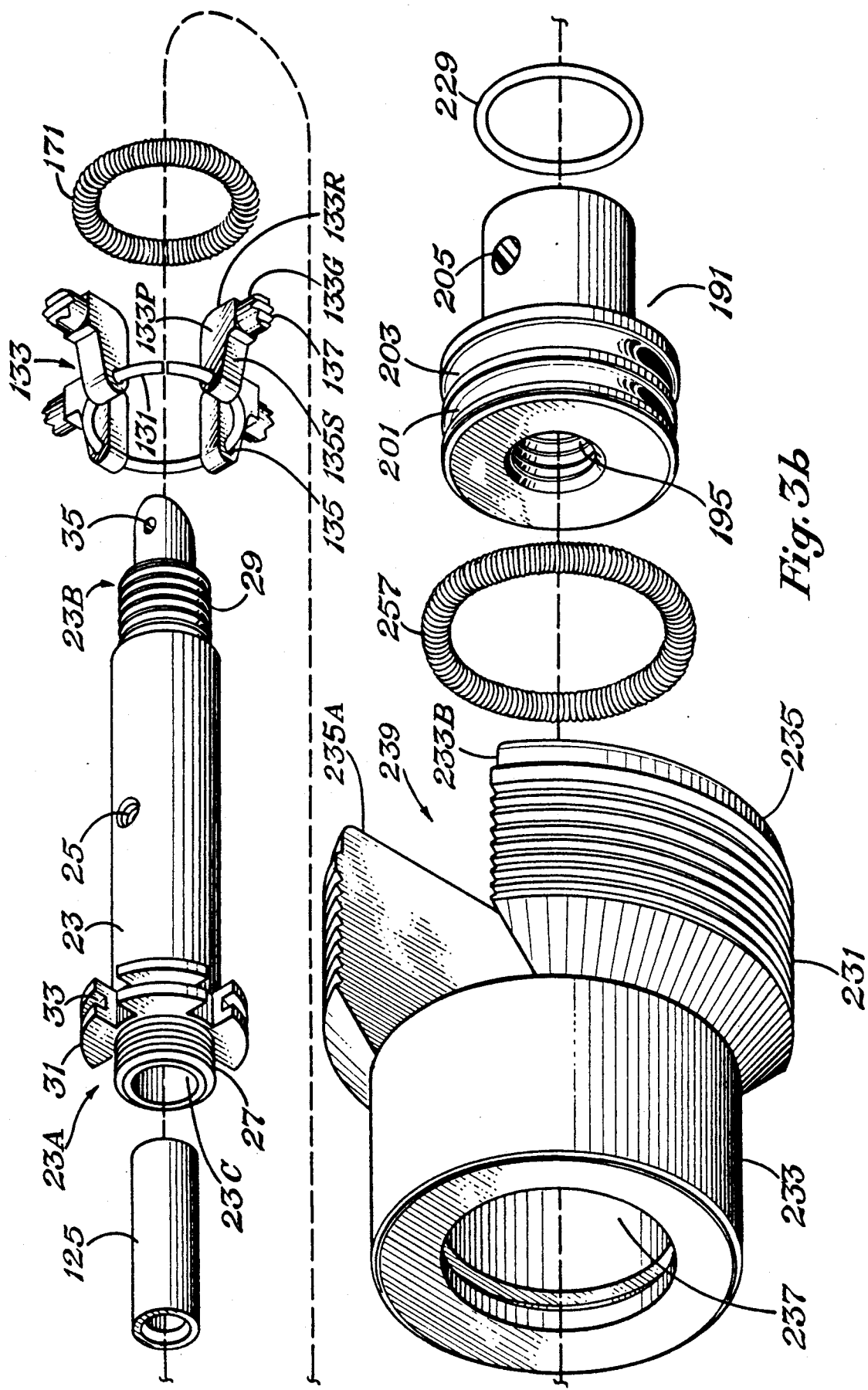
Figure 3C:
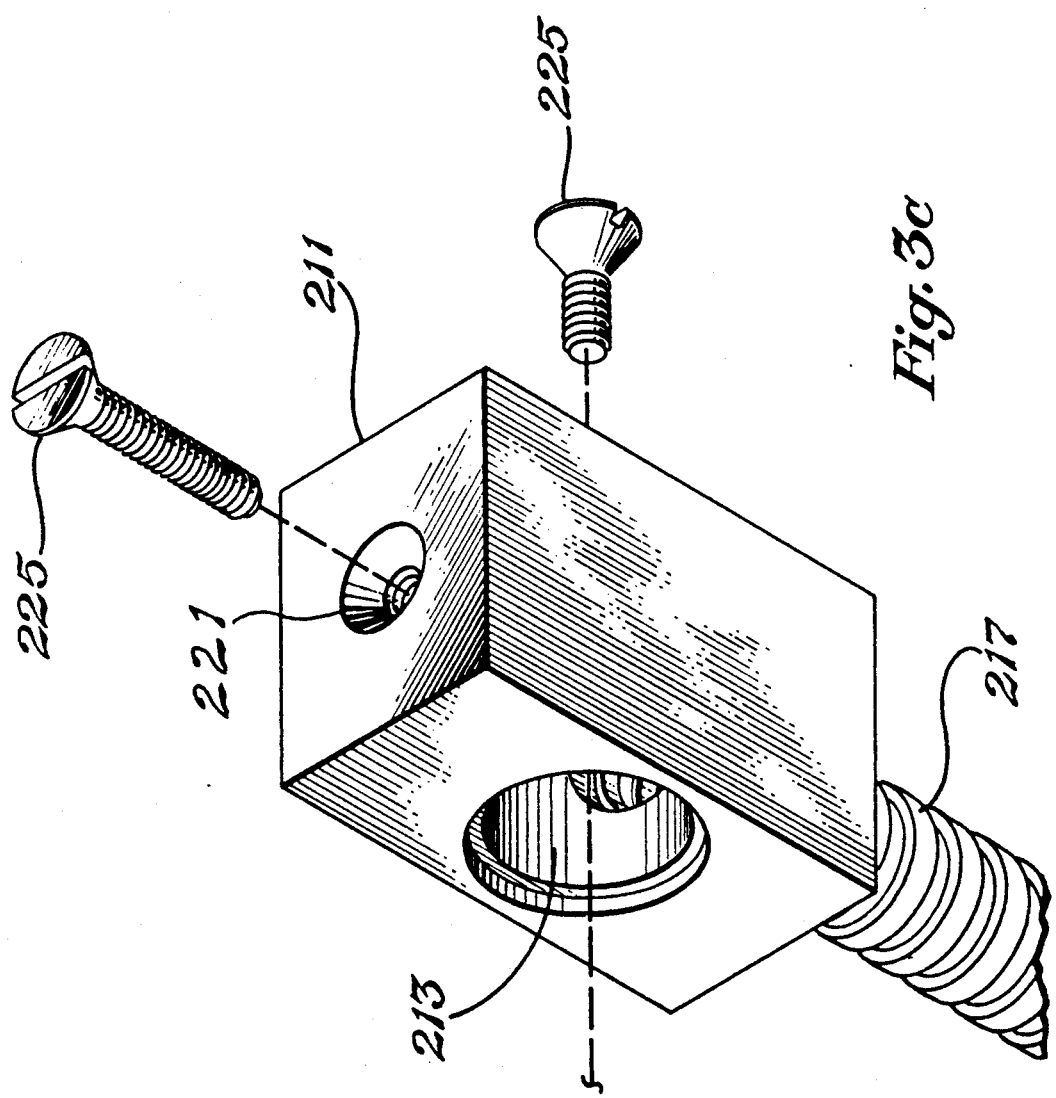

Referring to the drawings, the test probe of the invention is identified at 21. It comprises a hollow cylindrical shaped tubular body member 23 having a front end 23A, a rear end 23B, and a central cavity 23C extending therethrough. Member 23 is formed of metal. A plurality angularly spaced apart apertures 25 (only one of which is shown) are formed through the wall of the body member 23 at its central position. Threads 27 and 29 are formed at the front and rear ends respectively of the tubular body member 23. Immediately behind threads 27 are four angularly spaced apart, projections 31 which extend radially outward. Each of the projections 31 has an arcuate shaped groove 33 formed therein transverse to the axis of the tubular body member 23. All of the grooves 33 are aligned in the same plane. An aperture 35 is formed through the side wall of member 23 at its rear end.

An insulator member 41 formed of an electrical insulating material is connected to the front end of member 23. The insulator member 41 may be formed of a suitable plastic. It has a forward end 43 and a rear end 45 with an aperture 46 extending therethrough between ends 43 and 45. The forward end has a cylindrical shaped head 47 with a rear shoulder 49 extending outward from a cylindrical surface 51. The rear end has an outwardly extending flange 53 with a rear shoulder 55 extending outward from cylindrical surface 57. The aperture 46 has a forward cylindrical portion 59, a smaller cylindrical portion 61, and an enlarged rear portion 63. Threads 63T are formed in the wall forming the rear portion 63 which mate with threads 27 of member 23. Insulator 41 is connected to the front end of member 23 by screwing threads 63T to threads 27. A shoulder 65 is formed between surfaces 59 and 61.

A center metallic contact 71 is slidably coupled to the forward end 43 of the insulator 41. The contact 71 has a rearward facing cylindrical opening 73 which receives the head 47 and a inside annular slot 75 which receives a split ring 77 for limiting forward movement of the contact 71 on the forward portion of the insulator 41. Forward movement is limited when the ring 77 abuts the shoulder 49.

A metallic insert 81 is partially located in the aperture 45 of the insulator. Insert 81 has a reduced diameter forward portion 83, an enlarged diameter portion 84 with a shoulder 85 which abuts against shoulder 65, and a smaller diameter portion 87 which extends through aperture 61. Insert portion 87 has a rearward facing aperture 88 in which is inserted and crimped therein the wires 89 of an electrical lead 91 having electrical insulation 93 surrounding the wires 89. A metallic coil 95 spring is located in aperture 46 and has its forward end engaging the inside of center contact 49 and its rear end located around insert portion 83. The spring 95 urges the contact 71 forward and provides electrical connection between center contact 71 and insert 81 and hence to the lead 91.

A metallic ring 101 having an inside cylindrical surface has one end fitted around the surface 57 of the insulator 41. A metallic cylindrical body 103 having an inside cylindrical surface is secured around member 23 with its forward end 105 next to the rear end of the ring 101 forming a rearward facing opening 107 between the inside of cylindrical body 103 and the outer surface of tubular member 23. Member 103 maintains the ring 101 on surface 57 against shoulder 55. Body member 103 has a plurality angularly spaced apart of threaded apertures 109 formed through its wall near its rear end and a plurality of angularly spaced apart slots 111 formed in its front end 105. The body 103 is held in place by a plurality of threaded members 121, bushings 123 and tubular member 125. Tubular member 125 is located in the central aperture 23C of tubular member 23 and threaded members 121 are screwed through threaded apertures 109 of body 103, through hollow cylindrical bushings 123, through apertures 25 formed in tubular body member 23 until their inner ends tightly engage tubular member 125.

A metallic split ring 131 having four metallic latches 133 pivotally coupled thereto is inserted in the slots 33 of the projections 31 of the tubular member 23 such that the latches 133 can move inward and outward through the slots 111 formed in the front end 103 of cylindrical body. Each of the latches 133 is generally L-shaped in appearance having a pivot end 133P with an aperture 135 formed therethrough for receiving the ring 131 and a gripping end 133G with gripping teeth 137.

A cam sleeve member 141 having a cylindrical shaped inner surface 143 is located around the tubular member 23 in the opening 107 between the inside surface of body 103 and the ring 101 and the outer surface of member 23 for sliding movement between forward and rearward positions as shown in FIGS. 2 and 1 respectively, for moving the gripping portions 133G and teeth 137 of the latches outward through slots 111 for gripping purposes and inward to release positions. The main body of the cam sleeve member 141 has an outer cylindrical surface 145. A plurality of angularly spaced apart apertures 147 are formed through the wall of the member 141 for freely receiving the bushings 123. The apertures 147 are elongated in the direction of the length of the member 141 to allow the member 141 to move to its forward and rearward positions relative to the bushings 123 and the tubular member 23.

The forward portion of the member 141 has a neck 151 with a cone shaped outer cam surface 153 which tapers inward toward the axis from shoulder 155 towards its front end. Four slots 157 are formed in the neck for receiving a portion of the four latches 133 respectively. The neck 151 between the slots 157 flanges radially outward at 159 to four arcuate shaped members 161 which have extension portions 163 extending clockwise (as seen in FIG. 3a) from the flanges 159 with slots 165 formed between adjacent members 161. In the assembly process the latches are inserted into the slots 157 by way of slots 165. A coil spring 171 formed in the shape of toroid is located around the cam surface 151. The coil spring 171 is formed from spring type metal wire helically wound with its ends joined to form the annular coil spring 171.

A second electrical lead 181 comprising electrical wire 183 with insulation 185 has its wire end 187 inserted into the rear aperture 35 of the tubular member 23 and soldered thereto.

A detent member 191 having an aperture 193 formed therethrough and internal threads 195 at its forward end is connected to the rear end of the tubular member 23 by screwing its threads 195 to the rear threads 29 of the tubular member 23.

Electrical lead 91 extends rearward through tubular member 23 and through internal tubular member 125. The detent member 191 has a side opening 197 formed through its rear wall through which electrical leads 91 and 181 extend.

The detent member 191 has two outer annular slots 201 and 203 formed in its side wall at its forward end and two apertures 205 and 207 formed through its rear side wall and rear wall respectively. Aperture 207 is threaded.

A rear block 211 is provided having a main cylindrical opening 213 for receiving the rear cylindrical portion 191R of the detent member 191. A side opening 215 is formed through the side wall of the block 211 which intercepts the opening 213. The end of a hollow flexible cable 217 is connected in the opening 215 and the leads 91 and 181 extend out of the apparatus by way of the opening 215 and the cable 217.

Threaded aperture 221 and aperture 223 are formed through the side and rear walls of the block 211 for receiving screws 225 and 227. Screw 225 is screwed through aperture 221 and into aperture 205 and screw 227 is inserted through aperture 223 and screwed into aperture 207 for attaching the block 211 to the detent member 191. Member 229 is an O-ring.

A grip member 231 has a forward portion 233 and a rear portion 235. The forward portion 233 has an aperture 237 formed therethrough and rear portion 235 has a transverse slot 239 bifurcating the rear portion 235 into two spaced apart portions 235A and 235B. The aperture 237 leads to the slot 239. The rear portion of the cam member 141 and the forward portion of the detent member 191 extend into the aperture 237 and the block 211 loosely fits in the transverse slot 239.

The rear portion of the cam member 141 has an annular slot 241 formed in its outer wall and the inner wall of the forward portion of the grip member 231 has an annular slot 243 formed therein. A split ring 245 is located in the two slots 241 and 243 for connecting the grip member 231 and the cam member 141 together whereby the grip member 231 and the cam member 141 move together relative to the tubular member 23 when the cam member 141 is move to its latching and unlatching positions.

Two annular slots 201 and 203 are formed in the outer wall of the detent member 191 as indicated above and a large annular slot 255 is formed in the inner wall of the rear end of the portion 233 of the grip member 231. A coiled annular spring 257 similar to spring 171 but larger in diameter, is located in slot 255 and either of slots 251 or 253 when the cam member 141 and hence the grip member 231 are moved to the latching or unlatching positions to releasable hold the cam member 141 in either of these positions relative to the tubular member 23.

The cam member 141 may be moved to a rearward unlatching position, as shown in FIG. 1, or to a forward latching positions, as shown in FIG. 2. In the unlatching position, the teeth 137 of the latch members 133 are located inside of the wall openings 111 such that the teeth do not protrude radially outward beyond the maximum diameter of the shell or wall 101, 103 as shown in FIG. 1. In this position, the latch members 133 are in the unlatched position and the rearward inner edges 161E of the arcuate members 161 of the cam member 141 prevent the latch members 133 from extending radially outward. When the cam member 141 is moved toward its unlatching position, the tension of the spring 171 causes it to move forward on the cam tapered surface 153, to seek the smallest outside diameter, until further movement is prevented by the latch members 133. The smallest outside diameter of the surface 153 is slightly greater than the normal inside diameter of the spring 171.

When the cam member 141 is moved forward to its latching position relative to the tubular member 23, the cam member shoulder 155 moves closer to the latch members 133. The latch members 133 push the spring 171 closer to the shoulder 155, up tapered surface 153, increasing the tension of the spring. The tensioned spring 171 contacts the tapered rear surfaces 133R of the latch members 133 and forces the latch members 133 radially outward. The latch members 133 pivot radially outward about the ring 131 to a latched position, wherein the latching teeth 137 extend radially outward beyond the maximum diameter of the shell 101, 103 whereby the latch members 133 may latch the test probe 21 to the threaded inside wall of the opening of structure housing the device to be tested.

To release the test probe from the opening, the cam member 141 is moved to its rearward position relative to the tubular member 23, wherein, the arcuate members 161 move rearwardly along the outer surfaces 133S of the latch members 133, engaging and causing the latch members 133 to pivot inwardly to their unlatched position. The spring 171 moves forward relative to the cam member 141 to reduce its tension.

The teeth 137 of the latch member 133 are threads formed in a manner similar to the threads of the latches disclosed in U.S. Pat. No. 4,904,200. The individual latch members 133 are pivoted about a point which is located forward of the threaded latching portions 137. This allows the test probe to be inserted into the opening (structure opening) of the structure housing the device to be tested, regardless of which position the member 141 is in. Thus, the latch members can be in their latched positions, as shown in FIG. 2, and still be inserted into the structure opening, because the latch members will pivot inwardly, pushing the spring 171 closer to the shoulder 155 in order to ratchet past the interior threads of the structure opening. When the test probe is pushed all the way into the structure opening, the spring 171 will force the latch members 133 back out to the latched positions. To insure that the teeth 137 on the latch members have fully engaged the interior threads of the structure opening, the test probe can be rotated about is central axis. Furthermore, if the latch members become jammed in their latched positions, with the test probe inserted into an opening, the test probe can be removed from the opening by unscrewing.

Referring to FIGS. 1 and 2 there is disclosed an opening 271 in metal structure 273 into which the front portion of the apparatus of the invention may be inserted and latched thereto. The inside wall 275 of the opening has threads illustrated at 277 and 283. The structure 273 itself serves as an electrical connection (ground) to an electrical device to be tested. The connection of the structure 273 to the device and the device is not shown. An electrically insulating hollow annular member 279 has exterior threads 281 which are screwed to interior threads 283 formed on the inside of the opening. A metal hollow annular member 291 has exterior threads 293 which are screwed to interior threads 295 of member 279. Member 291 also has interior threads 297. Member 291 is electrically connected to the electrical device (positive side) to be tested. The electrical connection of the member 291 to the device is not shown.

The central contact 71 has a annular shoulder 71S formed on its outer surface. The center contact 71 has a maximum outside diameter less than that of the inside cylindrical surface 299 of the member 291 but greater than the opening within the threads 297. When the front end of the apparatus 21 is inserted into the opening 271, the center contact 71 will extend into annular member 291 until its shoulder 71S engages the rear portion of threads 297 making electrical contact with the threads and hence electrically connecting lead 91 with member 291 which is electrically connected to the device to be tested. The cam member 141 then is moved forward relative to tubular member 23 to move the latches 133 outward through the openings 111 to engage their teeth with the threads 277. This completes an electrical connection between lead 181 and the device to be tested by way of structure 273, latches 133, ring 131, and tubular member 23.

We claim:

1. A test probe apparatus, comprising:

body means having a front end and a rear end, support means carrying a first electrical contact means supported at said front end of said body means, a first electrical lead means coupled to said first electrical contact means and extending toward said rear end and out of said apparatus, wall means spaced from and surrounding said body means defining a surrounding space located between said wall means and said body means and having an opening facing rearward, a plurality of angularly spaced apart openings formed through said wall means, a movable sleeve means located around said body means, said sleeve means being movable between forward and rearward positions relative to said body means, at least the forward portion of said sleeve means being located for movement in said surrounding space, a plurality of latch means located in said surrounding space and having coupling portions pivotally coupled to structure of said apparatus at angularly spaced apart positions and latching portions located to move to outward and inward positions through said plurality of openings respectively, at least one of said latch means being formed of an electrically conducting material, means for electrically insulating said one latch means from said first electrical contact means whereby said one latch means forms a second electrical contact means, a second electrical lead electrically coupled to said one latch means and extending out of said apparatus, engaging means for engaging said plurality of latch means when said sleeve means is moved toward said forward position for moving said latching portions of said plurality of latch means outward through said plurality of openings for use for latching said test probe apparatus to structure of an opening, retracting means for retracting said latching means to their inward positions when said sleeve means is moved toward said rearward position.

2. The test probe apparatus of claim 1, wherein:

said support means comprises an electrical insulator means having forward and rearward ends, said first electrical contact means being supported by said forward end of said electrical insulator means, said body means comprising an electrically conducting member having said front end connected to said rearward end of said electrical insulator means, all of said plurality of latch means being formed of electrically conducting material and having their coupling portions pivotally coupled to said front end of said body means and in electrical contact therewith, said second electrical lead being electrically connected to said body means.

3. The test probe apparatus of claim 2, wherein:

said electrical insulator means has an aperture formed therethrough between said forward and rearward ends, said first electrical contact means being electrically coupled to said first electrical lead means by way of said aperture.

4. The test probe apparatus of claim 2, wherein:

said body means comprises a tubular body means, said first electrical lead means extends through said tubular body means toward said rear end and out of said apparatus.

5. The test probe apparatus of claim 2, wherein:

said wall means comprises first and second annular members, said first annular member having forward and rearward ends with said forward end being coupled to said rearward end of said electrical insulator means, said second annular member having forward and rearward ends with a plurality of angular spaced apart slots formed in said forward end of said second annular member defining said plurality of angularly spaced apart openings formed through said wall means, radial support means comprising a plurality of angularly spaced apart radially extending members connected between said body means and said second annular member for supporting said second annular member around said body member with its forward end next to said rearward end of said first annular member, said sleeve means having a plurality of angularly spaced apart opening formed therethrough for receiving said plurality of angularly spaced apart radially extending members and for allowing said sleeve means to move between its forward and rearward positions relative to tubular body means.

6. The test probe apparatus of claim 5, wherein:

said body means comprises a tubular body means, said first electrical lead means extends through said tubular body means toward said rear end and out of said apparatus.

* * * * *